United States Patent [19]

Suda et al.

[11] Patent Number: 5,502,338

[45] Date of Patent: Mar. 26, 1996

[54] POWER TRANSISTOR DEVICE HAVING COLLECTOR VOLTAGE CLAMPED TO STABLE LEVEL OVER WIDE TEMPERATURE RANGE

[75] Inventors: Minoru Suda, Takasaki; Masatoshi Nakasu, Shibukawa; Tetsuo Iijima, Maebachi, all of Japan

[73] Assignee: Hitachi, Ltd., Tokyo, Japan

[21] Appl. No.: 341,130

[22] Filed: Nov. 18, 1994

Related U.S. Application Data

[63] Continuation-in-part of Ser. No. 52,836, Apr. 27, 1993, Pat. No. 5,397,914.

[30] Foreign Application Priority Data

Apr. 30, 1992 [JP] Japan .................. 4-138034
Mar. 19, 1993 [JP] Japan .................. 5-85429
Nov. 24, 1993 [JP] Japan .................. 5-318987

[51] Int. Cl.$^6$ .................. H02H 9/02; G05F 1/613; H01L 27/02
[52] U.S. Cl. .................. 257/570; 257/551; 257/577; 361/263; 315/209 T; 123/651; 327/110; 327/575
[58] Field of Search .................. 257/570, 566, 257/567, 577, 106, 199; 315/209 T; 307/570, 253, 296.7, 310, 315; 361/263, 253, 254, 257; 123/651, 652; 327/110, 575

[56] References Cited

U.S. PATENT DOCUMENTS

| | | | |
|---|---|---|---|
| 4,013,904 | 3/1977 | Chick | 257/567 |
| 4,293,868 | 10/1981 | Iizuka et al. | 257/570 |
| 4,618,875 | 10/1986 | Flohrs | 257/570 |
| 4,928,053 | 5/1990 | Skard et al. | 323/284 |
| 5,025,298 | 6/1991 | Fay et al. | 257/529 |
| 5,079,608 | 1/1992 | Wodarczyk et al. | 257/379 |
| 5,115,369 | 5/1992 | Robb et al. | 307/570 |
| 5,136,348 | 8/1992 | Tsuzuki et al. | 257/603 |
| 5,204,988 | 4/1993 | Sakurai | 257/603 |
| 5,365,099 | 11/1994 | Phipps et al. | 257/328 |

FOREIGN PATENT DOCUMENTS

| | | |
|---|---|---|
| 58-84461 | 5/1983 | Japan . |
| 58-87873 | 5/1983 | Japan . |
| 1-202867 | 8/1989 | Japan . |
| 2-185069 | 7/1990 | Japan . |
| 2-192170 | 7/1990 | Japan . |
| 2-51256 | 11/1990 | Japan . |
| 3-38881 | 2/1991 | Japan . |
| 4-111363 | 4/1992 | Japan . |
| 4-139766 | 5/1992 | Japan . |
| 4-234173 | 8/1992 | Japan . |
| 5-218437 | 8/1993 | Japan . |
| 5-211293 | 8/1993 | Japan . |

*Primary Examiner*—Rolfe Hille
*Assistant Examiner*—David B. Hardy
*Attorney, Agent, or Firm*—Fay, Sharpe, Beall, Fagan, Minnich & McKee

[57] ABSTRACT

A power transistor device is provided which has a function of clamping the collector voltage to a stable level for a wide range of temperature variations. In the power transistor device, a plurality of pn junctions are formed to fabricate Zener diodes in the polycrystalline silicon film in the form of rings. The ring configuration of the Zener diodes eliminates an end at the pn junction and prevents the junction surface from being exposed, making it possible to use as a stable Zener voltage the dielectric strength characteristic of the pn junction having a very small temperature coefficient.

6 Claims, 9 Drawing Sheets

POWER TRANSISTOR DEVICE HAVING COLLECTOR VOLTAGE CLAMPED TO STABLE LEVEL OVER WIDE TEMPERATURE RANGE

This application is a continuation-in-part of U.S. application Ser. No. 08/052,836, filed Apr. 27, 1993, now U.S. Pat. No. 5,397,914.

BACKGROUND OF THE INVENTION

The present invention relates to a power transistor device and more specifically to a technology suitably applied to a so-called IC igniter, an ignition apparatus of internal combustion engines.

In a conventional ignition device (IC igniter) of a multi-cylinder internal combustion engine mounted in automobiles, a Zener diode (transformer) is provided between collector and base of a bipolar transistor making up a power transistor device used in the IC igniter to stabilize a voltage of a primary coil to be applied to each cylinder. A Zener voltage of the Zener diode stabilizes a reverse voltage produced in the primary coil. Such a power transistor device uses a Darlington transistor circuit. Japanese Patent Publication No. 51256-1990, corresponding to U.S. Pat. No. 4,618,875, discloses a power transistor device using the Darlington transistor circuit.

U.S. Pat. No. 5,115,369 discloses a JFET having a clamping polycrystalline silicon diode. U.S. Pat. Nos. 4,013,904 and 4,293,868 disclose a Zener diode connected between base and collector of an input transistor of a Darlington type. U.S. Pat. Nos. 4,928,053 and 5,079,608 describe a diode and a Zener diode connected between gate and drain of a power transistor. U.S. Pat. No. 5,025,298 discloses a back-to-back polycrystalline silicon diode coupled to a gate of a power TMOS device. U.S. Pat. No. 5,136,348 describes a technology to form a polycrystalline silicon P-N junction in a form of a ring.

U.S. Pat. No. 5,204,988 discloses a polycrystalline silicon bi-directional Zener diode coupled between gate and source of a MOS semiconductor device. The bi-directional Zener diode is formed ring-shaped at the circumference of a chip.

Japanese Patent Laid-Open Nos. 202,867/1989, 87,873/1983, 84,461/1983 and 111,363/1992 disclose a technology to form a polycrystalline silicon diode connected between gate and source of FET in a form of a ring at the circumference of a chip.

Japanese patent Laid-Open No. 185,069/1990, corresponding to U.S. Ser. No. 278,988, discloses a back-to-back polycrystalline silicon diode connected between gate and drain of IGBT.

Japanese Patent Laid-Open No. 38,881/1991 discloses polycrystalline silicon bi-directional Zener diodes connected between gate and source and between gate and drain of an insulated-gate field-effect transistor.

Japanese Patent Laid-Open No. 211,293/1993 discloses a MOSFET and a polycrystalline silicon Zener diode.

Japanese Patent Laid-Open Nos. 218,437/1993, 192,170/1990, 139,766/1992 and 234,173/1992 disclose a polycrystalline silicon diode coupled between gate and source of a MOSFET.

SUMMARY OF THE INVENTION

In power transistor devices mentioned above, a Zener diode provided between collector and base of a transistor is formed by using a pn junction in a silicon bulk. Hence, the Zener voltage of the Zener diode is determined by the concentration and depth of the pn junction in the silicon bulk. Further, the temperature characteristic of the Zener voltage in the Zener diode has a positive temperature characteristic coefficient (normally 1000–2000 ppm/°C.). Therefore, as the inventors of this invention have found, the Zener voltage increases with the ambient temperature of the power transistor device.

As the Zener voltage of the Zener diode increases, the reverse voltage of the primary coil increases correspondingly, so that the output voltage from the secondary coil to be applied to each cylinder becomes large. Take the following case for example. Suppose the Zener voltage is 370 V and the output voltage of the secondary coil is 50,000 V when the silicon bulk has a temperature characteristic of 1500 ppm/°C. and the ambient temperature of a power transistor is −40° C. Under this condition, when the ambient temperature of the power transistor device rises to 140° C., the Zener voltage increases to about 470 V and the output voltage of the secondary coil exceeds 60,000 V. The secondary coil has conventionally used cables having a large enough dielectric strength to allow for the voltage variations mentioned above. It is found by the inventors, however, that when the dielectric strength of the cables used is reduced because of demands for lower cost and lighter weight, the output voltage at time of voltage variation may become larger than the dielectric strength, resulting in breakage of the secondary coil cable.

An object of this invention is to provide a power transistor device which has a function of stably clamping a collector voltage when subjected to temperature variations.

Another object of this invention is to provide a power transistor device which has a collector voltage clamping means while minimizing an increase in chip area.

Still another object of this invention is to prevent the collector voltage clamping means from being physically broken (as by line break) and to improve reliability of the collector voltage clamping means.

These and other objects and novel features of this invention will become apparent from the following description in this specification and the accompanying drawings.

A representative aspect of this invention may be briefly summarized as follows. In a power transistor device, Zener diodes are formed in a polycrystalline silicon film by arranging a plurality of pn junctions to circle around a chip.

With this means, because the PN junctions are arranged in a ring, they have no end so that the junction surface can be prevented from being exposed. This allows the dielectric strength characteristic of the pn junction with a very small temperature characteristic coefficient to be utilized as a stable Zener voltage.

DESCRIPTION OF THE PREFERRED EMBODIMENTS

Reference is made to copending our U.S. application Ser. No. 08/052,836, filed Apr. 27, 1993, the subject matter of which is incorporated herein by reference.

Figure 3:
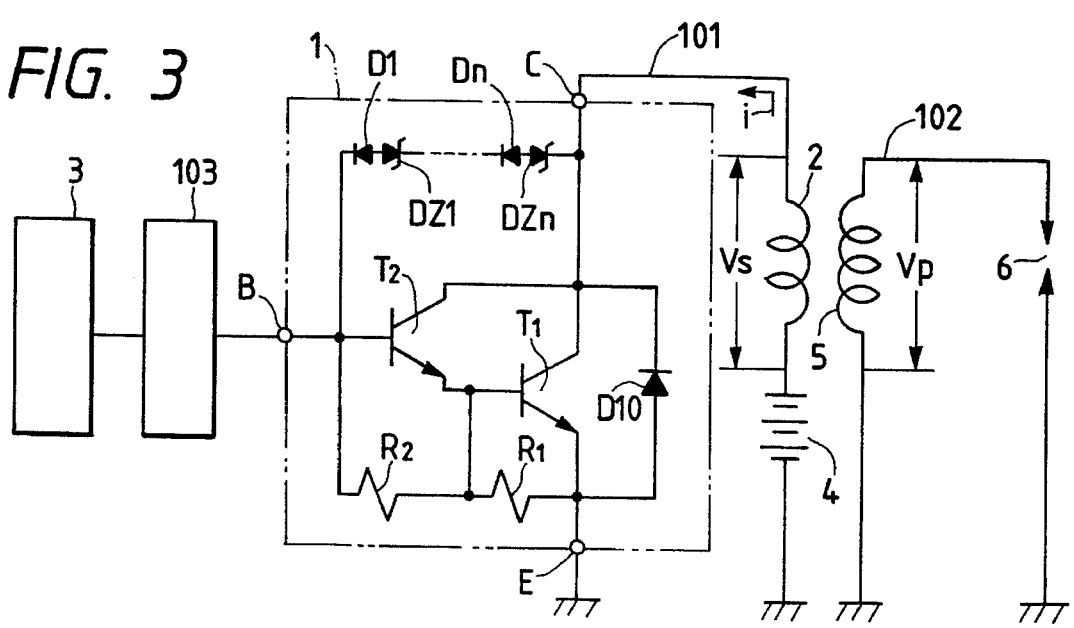
FIG. 3 is a circuitry of the first embodiment of the power transistor.

FIG. 3 shows a circuitry of a power transistor embodying the present invention. The power transistor of this embodiment is so constructed as to be used in what is generally called an IC igniter and is incorporated in a single IC pellet. That is, this power transistor device is fabricated on and in a single semiconductor substrate made of a material such as a monocrystalline silicon by a known semiconductor integrated circuit manufacturing technology.

A power transistor 1 has a collector terminal (first external terminal) C, a base terminal (second external terminal) B and an emitter terminal (third external terminal) E. The base terminal B is connected to a drive unit 103 outside the device. The drive unit 103 is connected to a pick-up unit 3 to receive a timing signal. The collector terminal C is connected to a primary cable (wire on the primary side) 101 outside the device. The primary cable 101 is connected to one end of a primary coil 2. The emitter terminal E is supplied a specified voltage (ground potential). The other end of the primary coil 2 is applied a voltage (say, 12 V) from a battery 4. A secondary coil 5 is magnetically coupled to the primary coil 2, so that the voltage on the primary side is stepped up in proportion to the turn ratio between the primary coil and the secondary coil and is output from the secondary coil 5. The output voltage of the secondary coil 5 is supplied, through a secondary cable (wire on the secondary side) 102 connected to the secondary coil 5, to an ignition plug 6.

The power transistor device is of a Darlington configuration consisting of an input-side driver transistor $T_2$ and an output-side power transistor $T_1$ as switching elements. The driver transistor $T_2$ has a control terminal (base) connected to the second external terminal B and a current path (collector-emitter path) connected between the first external terminal C and the third external terminal E. The power transistor $T_1$ has a current path (collector-emitter path) connected between the first external terminal C and the third external terminal E. Between the tied collectors and the tied bases of the driver transistor $T_2$ and the power transistor $T_1$ are formed Zener diodes $VZ_1$–$VZ_n$ and forward diodes $D_1$–$D_n$, which utilize pn junction structures formed in a polycrystalline silicon film as a voltage clamp means (transformer) to clamp a reverse voltage in the primary coil connected to the collector. A resistor $R_2$ is provided between the base and the emitter of the driver transistor $T_2$ and a resistor $R_1$ between the base and the emitter of the power transistor $T_1$. A diode $D_{10}$ is provided between the collector and the emitter of the power transistor $T_1$.

Next, the operation of a system incorporating the power transistor device of FIG. 3 is described below. The pick-up unit 3 outputs a timing signal to the drive unit 103, which, when the timing signal is at a first level, outputs a high level signal to the base terminal B, turning on the driver transistor $T_2$ and the power transistor $T_1$.

Next, when the timing signal changes from the first level to a second level, the drive unit 103 feeds a low level signal to the base terminal B causing the driver transistor $T_2$ and the power transistor $T_1$ to change from a conducting state to a non-conducting state. During this transition period a reverse voltage is generated raising the voltage at the first external terminal C. When the reverse voltage applied to the first external terminal C reaches a specified voltage $V_z$, the forward diodes $D_1$–$D_n$ and the Zener diodes $VZ_1$–$VZ_n$ conduct current i. This current i flows from the first external terminal C to diodes $D_1$–$D_n$ and $DZ_1$–$DZ_n$ to the base of the driver transistor $T_2$ to the resistor $R_2$ to resistor $R_1$ and to the third external terminal E. The current i clamps the potential of the first external terminal C to the specified voltage $V_z$. The clamp voltage $V_z$ is defined by an equation given below:

$$V_z = n \times (\text{forward voltage of each of } D_1\text{–}D_n) + n \times (\text{breakdown voltage of each of } VZ_1\text{–}VZ_n)$$

Here, suppose n=50, the forward voltage for each of $D_1$–$D_n$ is 1 V and that the breakdown voltage of each of $VZ_1$–$VZ_n$ is 7 V. Then, $V_z = 50 \times (1+7) = 400$ V.

Figure 1:
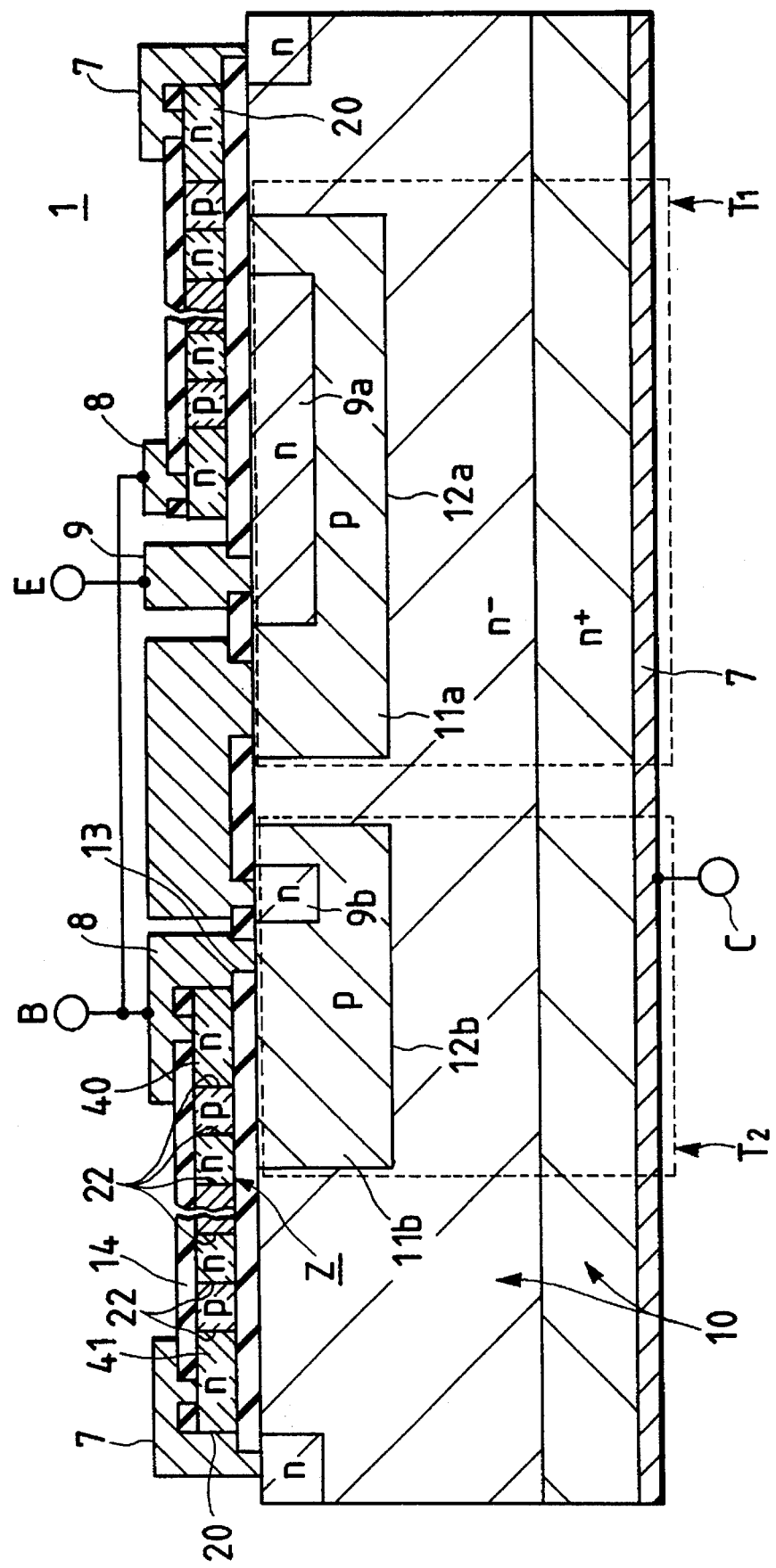
FIG. 1 is a cross-sectional view of a power transistor device as one embodiment of this invention.

FIG. 1 shows a cross section of a power transistor device as a first embodiment of this invention. The power transistor 1 is formed on a silicon substrate (hereinafter referred to simply as a substrate) 10, a semiconductor of n conductivity type. In this substrate 10, two p-conductivity type base regions for two transistors $T_1$, $T_2$—a first base region 11a and a second base region 11b—are formed by diffusion from the first main surface. The first base region 11a and the second base region 11b, together with the substrate 10, form a first pn junction 12a and a second pn junction 12b.

In these first and second base regions 11a, 11b, n-conductivity type emitter regions 9a, 9b for the two transistors $T_1$, $T_2$ are formed by diffusion from the same first main surface. An oxide film 13 as an inactive layer is formed selectively over the first main surface of the substrate 10 so as to cover the areas where the pn junctions are exposed on the surface.

On the emitter region 9a of the power transistor $T_1$ is formed an emitter electrode 9 by depositing a conductive metallic material such as aluminum. The emitter electrode 9 is connected to an emitter terminal E of the power transistor device 1.

On the base region 11b of the driver transistor $T_2$, a base electrode 8 is formed by depositing a conductive metallic material such as aluminum. The base electrode 8 is connected to the base terminal B of the power transistor device 1.

On a second main surface of the substrate 10 a collector electrode 7 is formed by depositing a conductive metallic material such as Ag. The collector electrode 7 is connected with the collector terminal C of the power transistor device 1. The base of the transistor $T_1$ and the emitter of the transistor $T_2$ are electrically connected with each other through interconnecting means formed of a conductive metal such as aluminum.

Over the oxide film 13, which is formed on the base regions 11b, 11a of the driver transistor $T_2$ and power transistor $T_1$ and on the substrate 10, are formed Zener diodes $DZ_1$–$DZ_n$ and forward diodes $D_1$–$D_n$ which have a pn junction structure formed in a polycrystalline silicon film and arranged like a ring along the circumference of the chip. That is, multiple pn junctions are arranged along the circumference of the chip like growth rings. The pn junction structure using the polycrystalline silicon film is explained below by referring to the manufacturing process diagrams of FIGS. 4(a), 4(b), 4(c) and 4(d).

FIGS. 4(a) through 4(d) show a manufacturing process of the Zener diodes $DZ_1$–$DZ_n$ used in the power transistor device 1 of this invention.

Figure 4A:
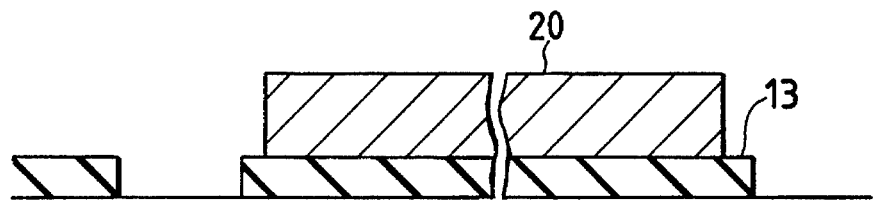
FIGS. 4(a), 4(b), 4(c) and 4(d) are manufacturing process diagrams of a Zener diode used in the power transistor of this invention.

As shown in FIG. 4(a), a polycrystalline silicon film 20 is selectively deposited by CVD over the oxide film 13 that is formed on the surface of the base region 11b of the driver transistor $T_2$.

Figure 4B:
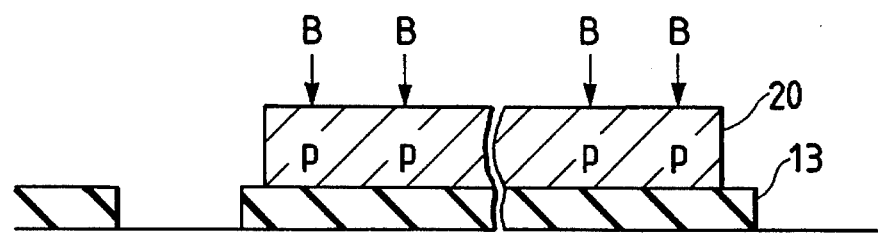

As shown in FIG. 4(b), a boron (B) as a p-conductivity type impurity is ion-implanted into the polycrystalline silicon film 20 to form a p-conductivity type region in the polycrystalline silicon film 20.

Figure 4C:
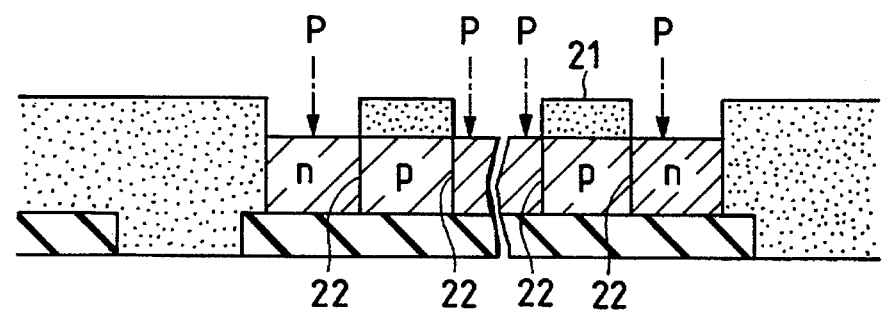

As shown in FIG. 4(c), a resist mask 21 is formed by lithography processing over areas of the polycrystalline silicon film 20 which are of p-conductivity type. Then, phosphorus (P) as an n-conductivity type impurity is ion-implanted through the mask 21 into the polycrystalline silicon film 20. As a result, a plurality of pn junctions 22 are formed in series with each other in the polycrystalline silicon film 20. In the figure, only four pn junctions 22 are shown for simplicity. It is noted, however, that because the clamp voltage (Zener voltage) $V_z$ is determined by the dielectric strength of the pn junction 22, a large number of pn junctions 22 are provided corresponding to the desired clamp voltage (Zener voltage) $V_z$.

Figure 4D:
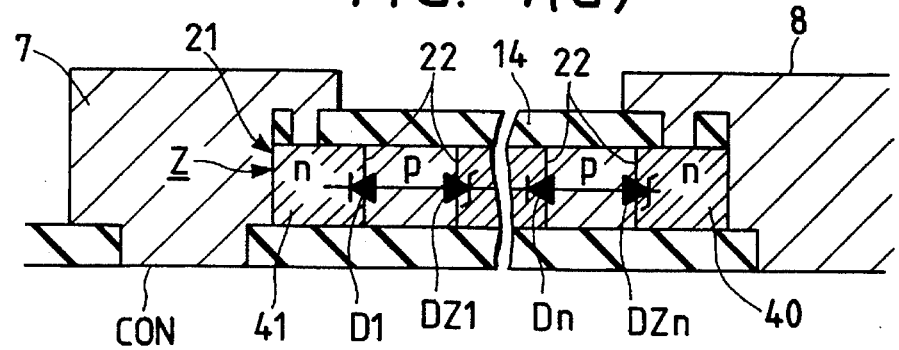

As shown in FIG. 4(d), a protective oxide film 14 is deposited over the polycrystalline silicon film 20 in which the pn junctions 22 are formed.

Of the n-conductivity type (n-type) regions and p-conductivity type (p-type) regions formed in the polycrystalline silicon film 20 as described above, an n-type region 40 at one end is electrically connected to the base electrode 8. An n-type region 41 at the other end is electrically connected to the first main surface of the substrate 10 through an interconnect means 7 formed of a conductive metal such as aluminum and through a contact portion CON with the substrate 10. Hence, the n-type region 41 is electrically connected to the collector electrode 7 of the second main surface through the substrate 10.

The resistors $R_1$, $R_2$ provided between the base and the emitter of the transistors $T_1$, $T_2$ in the circuit diagram of FIG. 3 are formed, for instance, in the substrate 10 but are not shown in FIG. 1.

Figure 2:
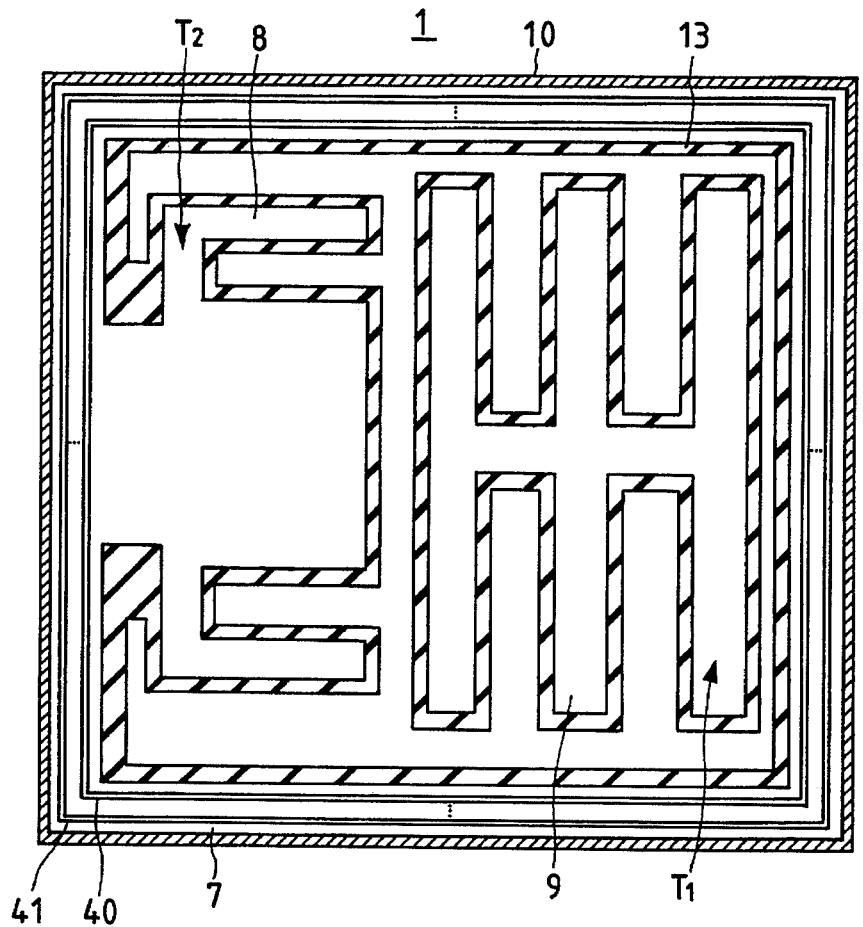
FIG. 2 is a layout of the first embodiment of the power transistor.

FIG. 2 shows a layout of the first embodiment of the power transistor device 1 according to this invention. Shown shaded by thick inclined lines is an oxide film; and the area shaded by fine inclined lines is formed of a conductive metal such as aluminum.

At the right-hand side of the chip is formed the emitter electrode 9 of the power transistor $T_1$; and at the left-hand side is formed the base electrode 8 of the driver transistor $T_2$. The Zener diodes $DZ_1$–$DZ_n$ and the forward diodes $D_1$–$D_n$ are formed like a ring encircling the circumference of the chip.

The n-type region 40 of the Zener diode $DZ_n$ may be connected to the base electrode 8, and the n-type region 41 of the forward diode $D_1$ may be connected, through the interconnect means 7 formed of metal and the contact portion CON, to the substrate 10 that acts as the collector region of the transistors $T_1$, $T_2$. These pn junctions arranged like a growth ring are completely covered by an overlying insulation film to improve the stable Zener dielectric strength characteristic.

Next, by referring to FIG. 3, the operation of the power transistor device of this invention 1 when applied as a so-called IC igniter is described.

The IC igniter is mounted in automobiles to control the engine firing timing. When the pick-up unit 3 to specify the engine firing timing turns on the transistors $T_2$ and $T_1$, the collector current of the power transistor $T_1$ causes a current i to flow through the primary coil 2, an inductive load. Because the driver transistor $T_2$ and the power transistor $T_1$ are arranged in a Darlington configuration, a relatively small base current supplied from the pick-up unit 3 to the base of the driver transistor $T_2$ is amplified by a combined current amplification factor of the two transistors $T_1$ and $T_2$ into a large current that flows through the primary coil 2 as the current i.

When, at the firing timing, the pick-up unit 3 cuts off the base current to the transistors $T_2$, $T_1$ to turn them off, the current i flowing through the primary coil 2 is interrupted. In the primary coil 2, the interruption of the current i generates a reverse voltage $V_s$, which is clamped by the Zener voltage $V_z$ of the Zener diode VZ to a constant voltage. Then the voltage $V_s$ is stepped up according to the turn ratio between the primary coil 2 and the secondary coil 5 to form a high voltage $V_p$. As the high voltage $V_p$ is supplied to the electrode of the ignition plug 6, a spark is generated, firing the engine.

The current supplied to the base terminal B of the power transistor device 1 may be controlled by computer at an optimum timing based on a timing signal (firing signal) detected by the pick-up unit 3 installed in a distributor.

In this embodiment, the Zener diodes are constructed of the pn junctions formed in the polycrystalline silicon film. The Zener diodes formed by using a polycrystalline silicon film are extremely small such that the temperature characteristic coefficient (ppm/°C.) is nearly zero, which is characteristic of the polycrystalline silicon. Further, the rate of change of temperature for carriers' average free path in a polycrystalline silicon is smaller than that in a single crystal silicon. Thus, in a wide temperature range from as low as −40° C. to as high as +140° C., the voltage $V_s$ of the primary coil 2, i.e., the clamp voltage (Zener voltage) $V_z$ can be kept almost constant.

Accordingly, the output voltage $V_p$ produced in proportion to the turn ratio between the primary coil 2 and the secondary coil 5 is clamped to a stable voltage. This in turn makes it possible to provide a stable spark voltage in the above wide temperature range. As a result, the dielectric strength of the cable (secondary cable) 102 that feeds the output voltage $V_p$ to the ignition plug can be reduced to the minimum required, contributing to reduced cost and weight.

In the case of the Zener diodes using a diffused layer as in the conventional power transistor devices, if the Zener voltage $V_z$ is set at around 350 V according to the Zener diodes' temperature characteristics so that a sufficient primary coil voltage can be produced even at low temperatures such as −40° C., the Zener voltage $V_z$ at a high temperature of +140° C. will reach an excessively high voltage of more than 440 V, making it necessary to increase the dielectric strength of the cable 102 connected to the secondary coil 5. Hence, considering the temperature characteristics, the electric circuit including cables must be designed so that the wiring has a dielectric strength high enough to withstand and feed the voltage $V_p$ of the secondary coil to the ignition plug.

Figure 5:
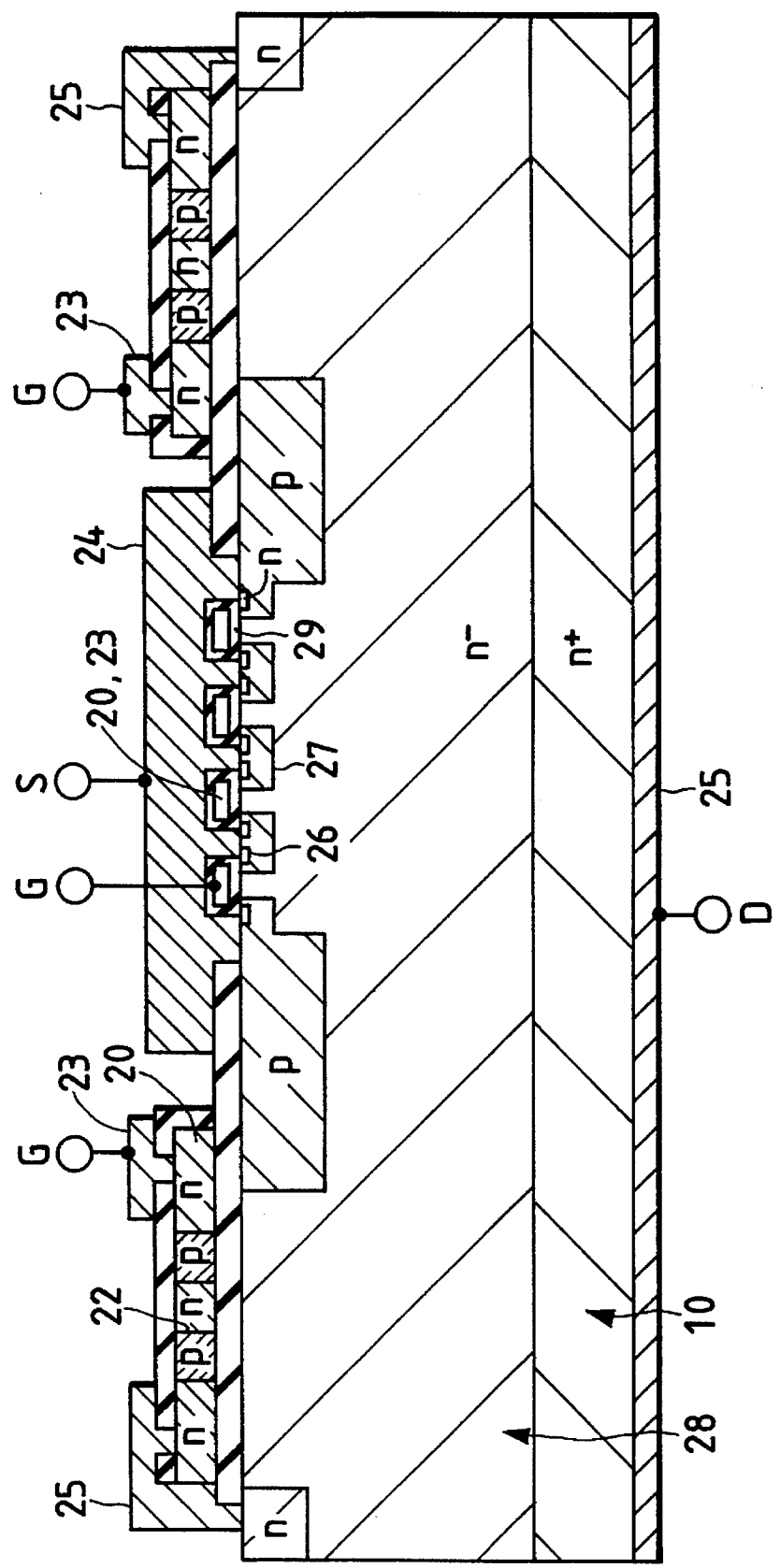
FIG. 5 is a cross-sectional view of a power transistor device as a second embodiment of this invention.

FIG. 5 shows the cross-sectional structure of a power transistor device as a second embodiment of this invention. The power transistor of this embodiment uses a vertical type power MOSFET (insulated-gate field-effect transistor). The power MOSFET uses as a drain region a silicon substrate 10 of n-type semiconductor and an $n^-$-type region 28 formed over the substrate 10 and, as a channel region, p-type regions 27 formed over the first main surface. In the channel regions 27 are formed n-type regions 26 that constitute a source region. Over the channel regions 27 and the drain region 28 are formed gate electrodes 23 made from a polycrystalline silicon layer 20, with a thin gate insulating film 29 interposed therebetween. In the figure, the gate electrodes 23 and the polycrystalline silicon layer 20 are shown identical.

The source regions 26 and the channel regions 27 are each connected commonly by an interconnect means of such a metal as aluminum. Zener diodes similar to those described earlier are arranged in rings that extend from the channel regions of the power MOSFET toward the outside of the chip. That is, the inner ring-shaped n-type regions are connected to the gate electrode G through the interconnects 23. The outer ring-shaped n-type regions are connected through an interconnect means 25 to n-type regions for ohmic contact provided in the drain region 28. The drain electrode D is formed of an electrode 25 of such a metal as aluminum which is provided on the second main surface of the substrate 10.

Figure 6:
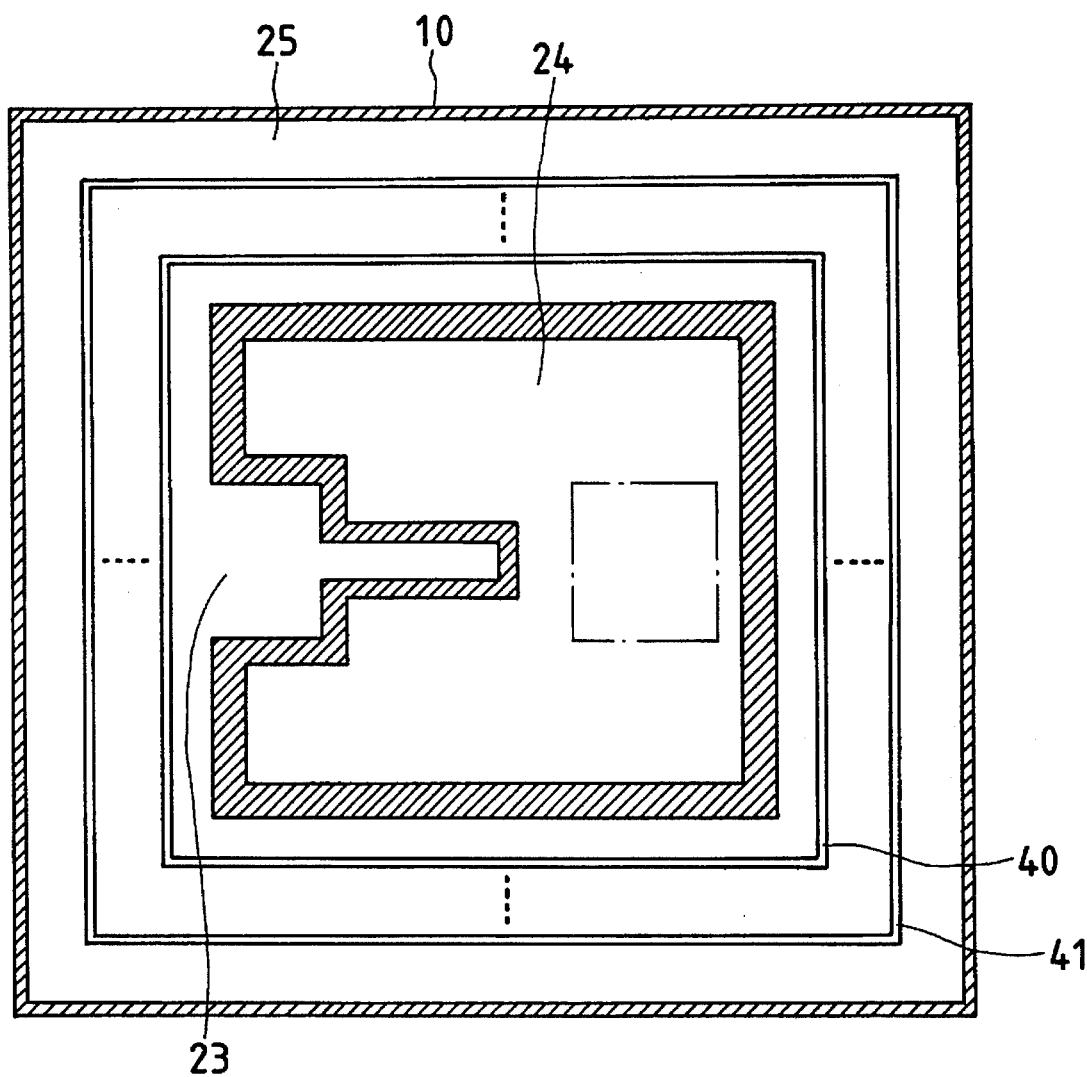
FIG. 6 is a layout of the second embodiment of the power transistor of FIG. 5.

FIG. 6 shows a layout of the second embodiment of the power MOSFET of FIG. 5. The n-type region 40 forming the Zener diode $DZ_n$ and arranged to circle along the outer circumference of the chip is connected to the gate electrode by an interconnect means 23. The gate electrode extends toward the right at the center and is connected to a gate electrode of MOSFET provided below. The n-type region 41 forming the forward diode $D_1$ is connected through an interconnect means 25 to an ohmic contact region that is connected to the drain region. The power MOSFET of this embodiment has a structure in which the Zener diodes $DZ_1$–$DZ_n$ and the forward diodes $D_1$–$D_n$ are formed between the gate and the drain so that the reverse voltage produced in an inductive load provided in the drain will not cause an insulation breakdown between the gate and the drain of the power MOSFET.

Figure 7:
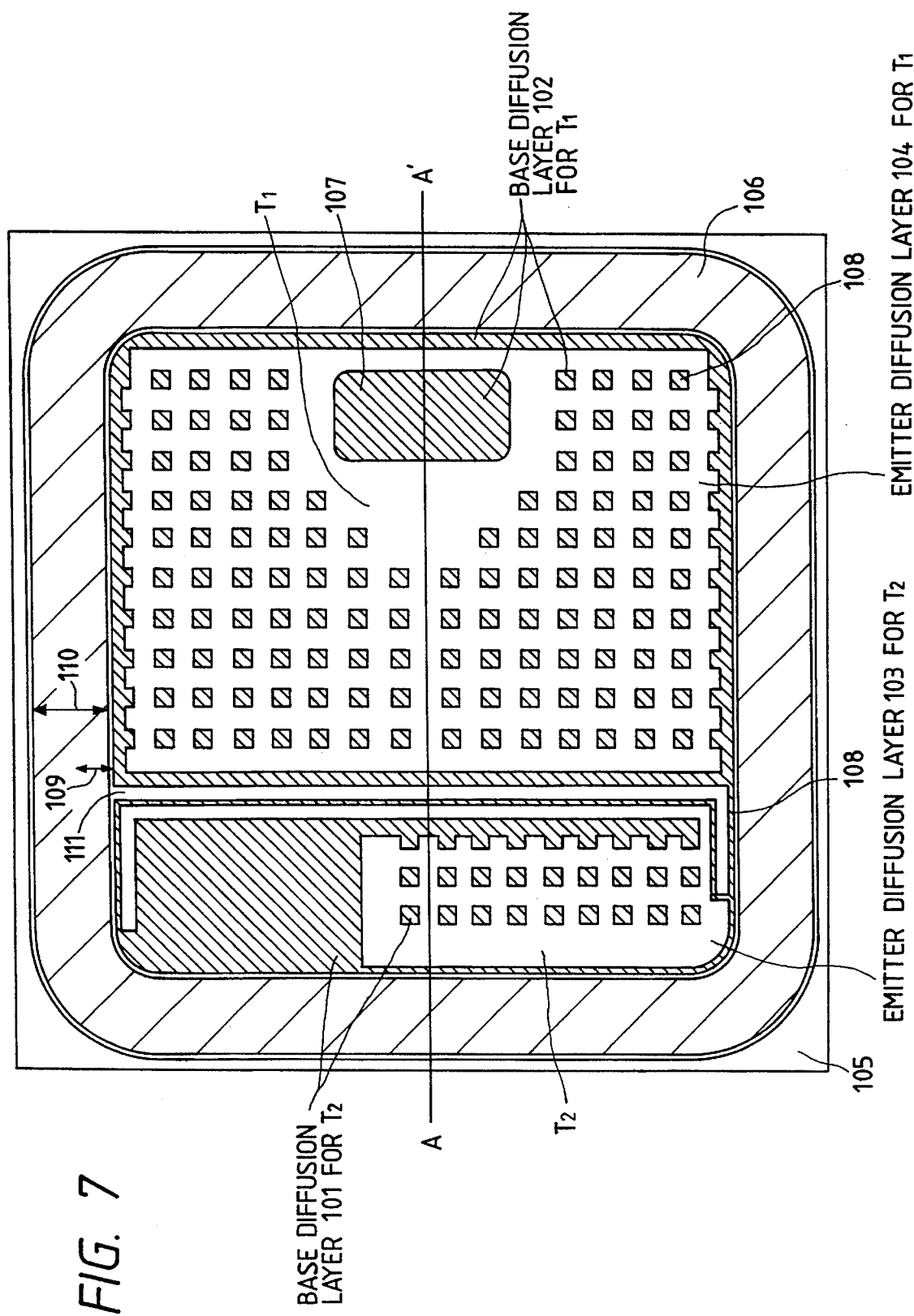
FIG. 7 is a chip layout showing base diffusion layers, emitter diffusion layers and a polycrystalline silicon film.
Figure 8:
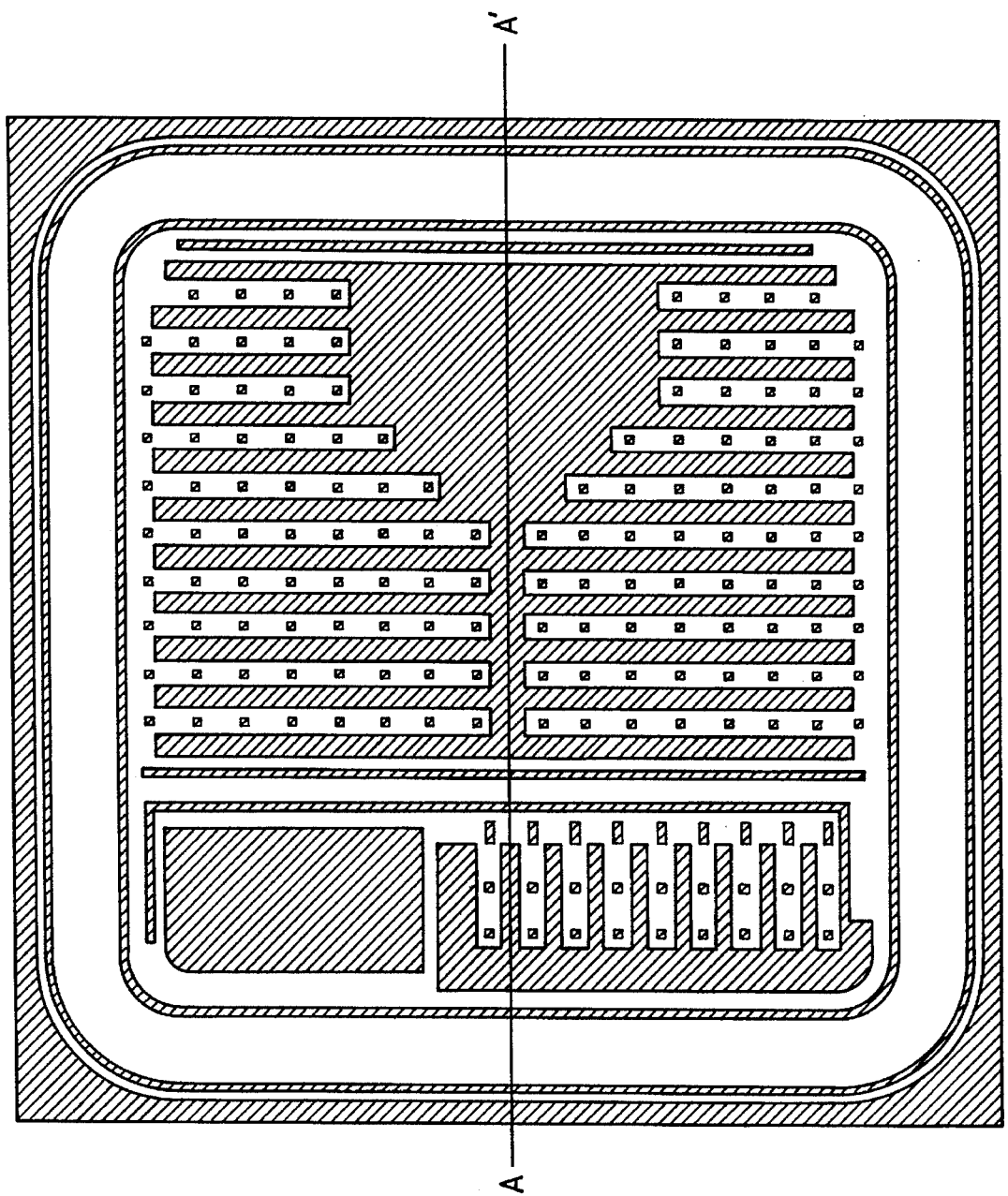
FIG. 8 is a chip layout showing contact regions.
Figure 9:
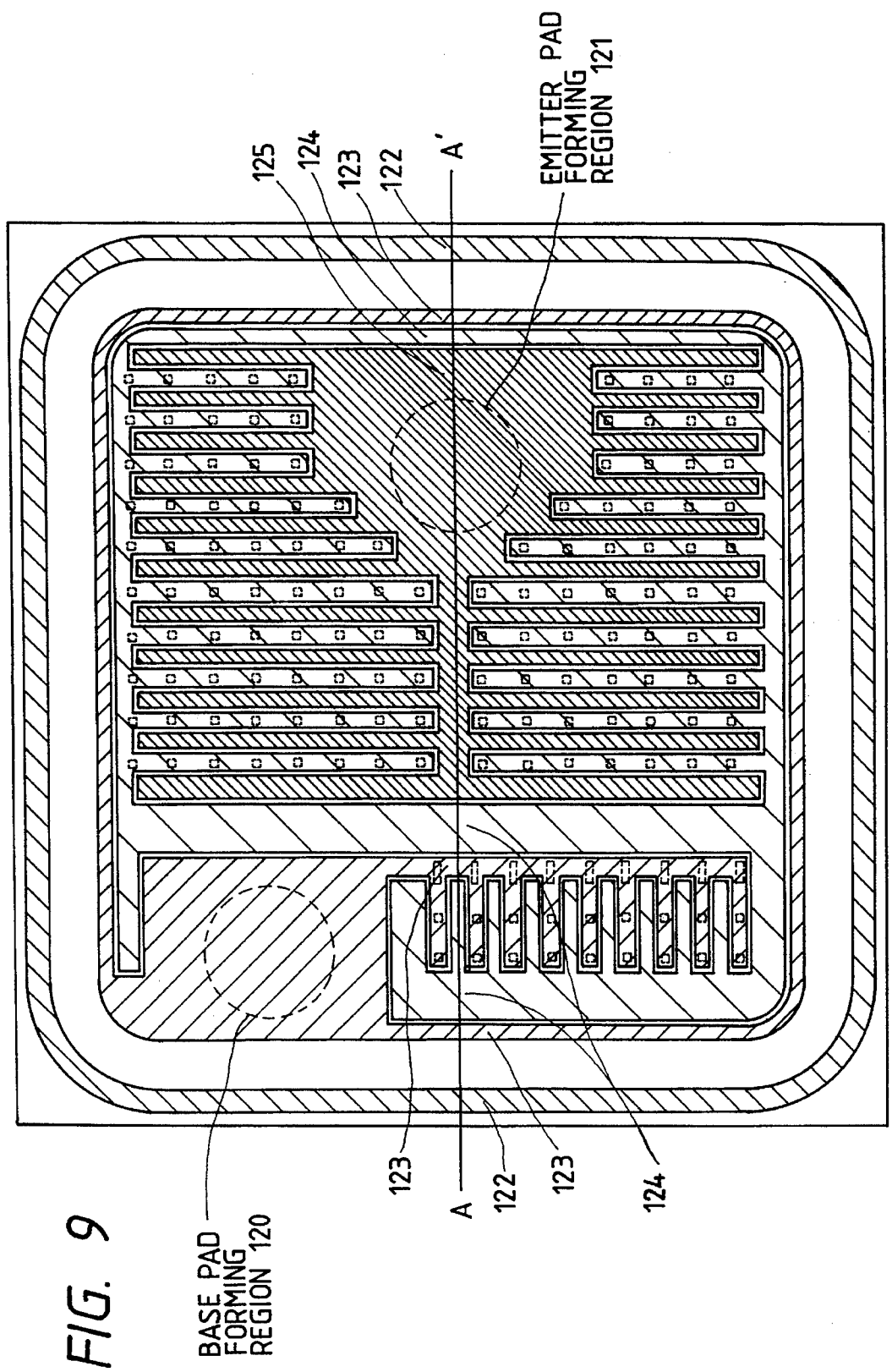
FIG. 9 is a chip layout showing metal interconnects.

FIGS. 7 to 9 show another example of chip layout of the power transistor device 1 shown in FIG. 3. The power transistor device is fabricated in the order of FIG. 7, FIG. 8 and FIG. 9. That is, FIG. 7 to FIG. 9 show the manufacturing process according to the chronological order. The fabrication process is described in the following by referring to FIGS. 7 to 9.

Shown in FIG. 7 are a base region (base diffusion layer) 101 of the driver transistor $T_2$ of FIG. 3; an emitter region (emitter diffusion layer) 103 of the driver transistor $T_2$ formed inside the base region 101; a base region (base diffusion layer) 102 of the power transistor $T_1$; an emitter region (emitter diffusion layer) 104 of the power transistor $T_1$ formed within the base region 102; a contact region (contact diffusion layer) 105 for the substrate 10; a polycrystalline silicon film 106 for clamp diodes where Zener diodes $DZ_1$–$DZ_n$ and forward diodes $D_1$–$D_n$ are formed; a diffusion layer 108 for resistor $R_2$; opening portions 107 of the emitter diffusion layer 104 for the diode $D_{10}$; and opening portions 108 of the emitter diffusion layer 104 for base contact of the power transistor $T_1$.

The opening portions 107 are regions where the emitter diffusion layer is partly not formed inside the base region 102 of the power transistor $T_1$ in order to allow a diode $D_{10}$ to be formed. This permits securing a sufficiently wide area to form the diode $D_{10}$, making it possible to increase the dielectric strength between the collector and the emitter of the power transistor $T_1$.

The opening portions 108 are regions where the emitter diffusion layer 104 is partly not formed inside the base diffusion layer 102 of the power transistor $T_1$. Provision, inside the base diffusion layer 102, of the mesh-like regions where the emitter region 104 is not formed (a so-called mesh-emitter configuration) allows a ratio $L_E/A_E$, where $L_E$ is an emitter's circumferential length and $A_E$ is an emitter area, to be increased. This makes it possible to provide a frequency characteristic and an output characteristic equal to or higher than those of other than the mesh-emitter configuration, while using a smaller area.

The polycrystalline silicon film 106 for clamp diodes is formed in a ring around the circumference of the chip. Because the clamp diodes $DZ_1$–$DZ_n$ and $D_1$–$D_n$ are formed in rings, it is possible to increase the area where the n-type region and the p-type region contact each other to form clamp diodes. This in turn makes it possible to lower the ON resistance of the Zener diodes $DZ_1$–$DZ_n$ when the Zener diodes break down and also to reduce the ON resistance of the forward diodes $D_1$–$D_n$ when the forward current flows through the forward diodes.

It is therefore possible to keep the ON resistance of the clamp diodes below a specified level while keeping the area of polycrystalline silicon film occupied by the clamp diodes below a certain level.

Generation of a counter electromotive force produces a potential difference of several hundred volts between the base and the collector of the driver transistor $T_2$ and power transistor $T_1$. It is required that each of the transistors has a high enough dielectric strength between the base and the collector to withstand this potential difference so that these transistors will not break down. That is, if the dielectric strength between the base and the collector is small, when the collector potential is a specified voltage higher than the base potential, a current flows from the collector of the n-type region to the base of the p-type region. As a result, the transistor will not operate normally. To secure a sufficient base-collector dielectric strength requires securing a large enough area where a depletion layer of the base diffusion layers 101, 102 of the transistors $T_1$, $T_2$ spreads. Providing a sufficient depletion region can mitigate the concentration of electric field at the base-collector boundary, thus improving the base-collector dielectric strength.

The above requirement (provision of a depletion layer) makes it necessary to leave a space between the circumference of the base diffusion layers 101, 102 and the sides of the chip (in the vertical or horizontal direction in the figure). This spacing or distance 109 may, for example, be 200μ. A major part of the space between the circumference of the base diffusion layers 101, 102 and the sides of the chip is almost planar. By utilizing as the clamp diode forming region 106 an area over the depletion-layer-forming chip circumferential region, an effective use can be made of the chip area. The minimum required width 110 for the clamp diode forming region 106 is, for example, 470μ. In this case, nearly a half the polycrystalline silicon film 106 for the clamp diode is formed over the depletion-layer-forming chip circumferential region.

The base diffusion layer of FIG. 7 is formed by implanting boron (B) into the substrate 10 with the $SiO_2$ film as a mask and allowing it to diffuse into the substrate. The emitter diffusion layer is formed by implanting and diffusing arsenic (As) into the base diffusion layer with the $SiO_2$ film as a mask. The oxide film over the emitter diffusion layer is about 8,500 Å (0.85μ) thick, and the oxide film over the base diffusion layer is about 28,500 Å (2.85μ) thick. The thickness of the oxide film over the region 111 where neither the base diffusion layer nor the emitter diffusion layer is formed is 33,500 Å (3.35μ).

After the base and emitter diffusion layers are formed, a polycrystalline silicon film (clamp diode forming region)

106 is formed on that area of the chip circumferential portion which covers the planar oxide film deposited over the area where none of the base and emitter diffusion layers are formed. The reason why a part of the polycrystalline silicon film 106 is not formed on the oxide film over the base diffusion layer is that because the thickness difference between the oxide film on the region where neither base diffusion layer nor the emitter diffusion layer is formed and the oxide film over the base diffusion layer is 3.35−2.85= 0.5μ, the polycrystalline silicon film about 4,500 Å (0.45μ) thick may be broken at the stepped portion where the thickness changes.

After the base and emitter diffusion layers and the polycrystalline silicon film are formed, a PSG film is formed on the base and emitter diffusion layers and on the polycrystalline silicon film for producing a planar surface. The thickness of the PSG film may be 12,000 Å (1.2μ).

FIG. 8 shows as shaded areas the contact portions CONT where the PSG film and the underlying $SiO_2$ film are removed in a contact hole forming process that is performed after the PSG film forming process.

FIG. 9 shows as shaded areas the metal interconnects (aluminum interconnects, for example) formed in a metal interconnect forming process that is performed after the contact hole forming process. Metal interconnects 122–125 are each closed and separated from each other. After the metal interconnect forming process, a base pad is formed in a base pad forming region. The base pad is electrically connected by wiring to the drive unit 103 outside the chip. An emitter pad is formed in a emitter pad forming region 121 and is electrically connected to the primary cable 101 outside the chip.

The base diffusion layers 101, 102 are p-type conductive layers and the emitter diffusion layers 103, 104 and diffusion layer 105 are n-type conductive layers.

Figure 10:
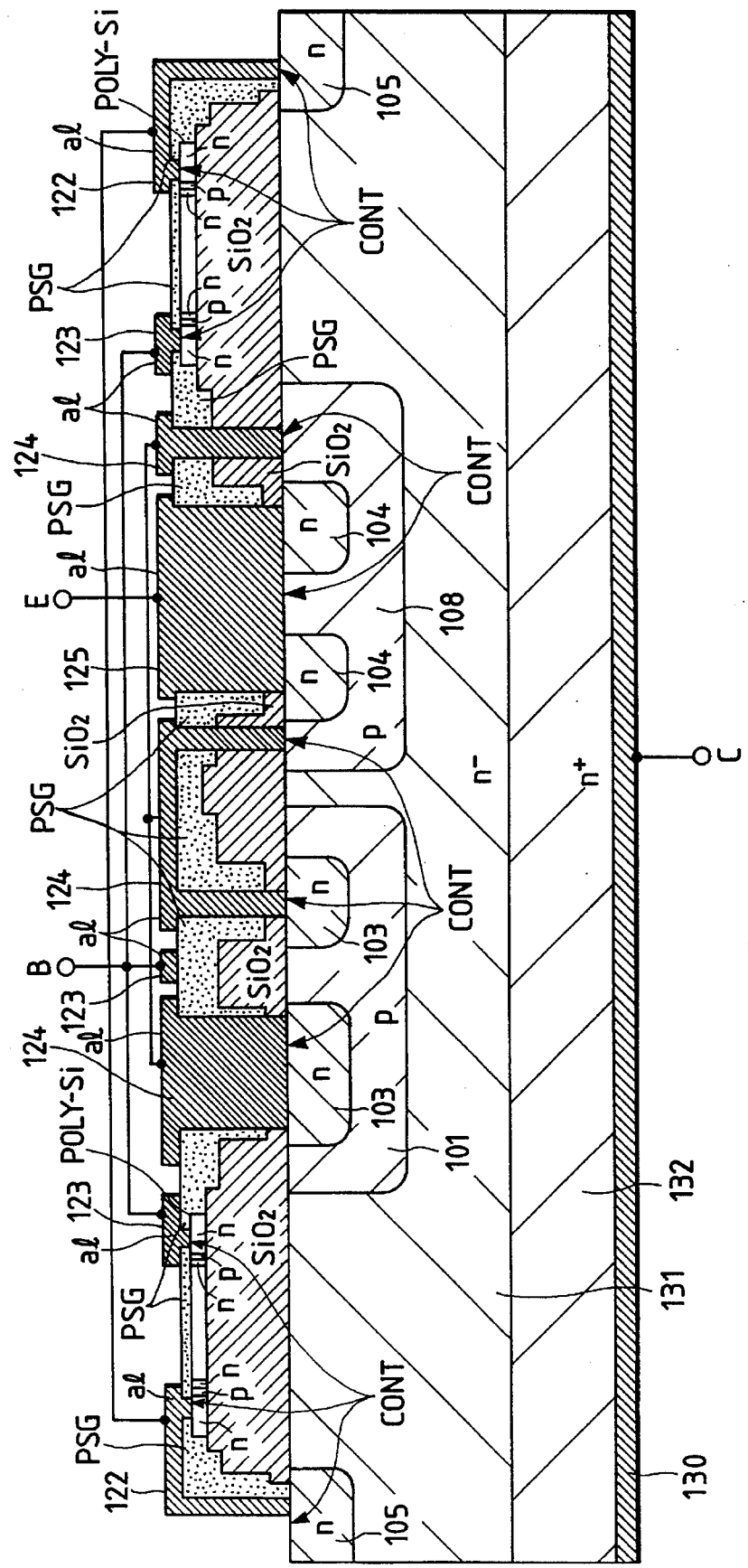
FIG. 10 is a cross-sectional view of a power transistor device as a third embodiment of this invention.

FIG. 10 is a cross section taken along the line A—A' of FIGS. 7 to 9. The figure shows the arrangement of layers and their connection and does not consider the actual dimensional relationship.

The symbols and reference numerals correspond to those of FIGS. 7 and 9. Here, we will describe what is not shown in FIGS. 7 to 9.

Denoted 131 is an n-type substrate, whose impurity concentration is lower than that of the emitter diffusion layers 103, 104 and the diffusion layer 105. Designated 132 is an n-type substrate, whose impurity concentration is lower than that of the emitter diffusion layers 103, 104 and the diffusion layer 105. Reference number 130 represents a conductive film formed of such materials as B represents a base pad, which is electrically connected to a metal interconnect 123. E represents an emitter pad, electrically connected to a metal interconnect 125. C indicates a collector pad, which is supplied a ground potential from outside the chip.

A plurality of metal interconnects 122 in the figure are commonly connected with each other on a surface that extends in a vertical direction in the figure. Likewise, a plurality of metal interconnects 123 and 124 are also commonly connected on a surface that extends in a vertical direction in the figure.

The advantages of the above embodiments are summarized as follows.

(1) In the power transistor device, a plurality of pn junctions are formed in a polycrystalline silicon film in the form of rings that circle around the circumference of the chip to form Zener diodes and forward diodes. This arrangement eliminates the end of the pn junction and allows the pn junction area to be increased. This in turn makes it possible to obtain a dielectric strength characteristic of pn junctions which has a very small temperature coefficient, and a stable Zener voltage (clamp voltage). As a result, the Zener voltage can be kept constant regardless of wide temperature variations.

(2) Because the power transistor device incorporating the above Zener diodes of (1) is used in an IC igniter, the primary voltage can be kept at a constant voltage even in an engine room where temperature changes in a wide range. This means that the stepped up secondary voltage can also be kept stable, stabilizing the firing operation of the engine. As a result, the dielectric strength of the cable connecting the secondary coil and the ignition plug can be set to the minimum required level, reducing cost and weight.

(3) The polycrystalline silicon film is formed on the first main surface of the substrate and the pn junctions are formed in rings. This makes the structure and the manufacturing process simple, improving the productivity.

(4) Because the Zener voltage of the Zener diode is determined by the number of pn junctions formed in the polycrystalline silicon film, it is easy to set the Zener voltage to a desired level.

(5) The polycrystalline silicon film is formed over that area of depletion layer extending from the base diffusion layer of the driver transistor and power transistor which covers the space region between the base diffusion layer and the chip circumferential portion. This allows an efficient layout of the polycrystalline silicon film while suppressing an increase in the chip area.

(6) By forming the polycrystalline silicon film over a virtually planar oxide film, it is possible to prevent breakage of the polycrystalline silicon film.

The embodiments of this invention have been described in detail. The present invention is not limited to these embodiments and various modifications may be made without departing from the spirit of the invention. For example, in the embodiment of FIG. 2, while the Zener diodes 20, 22 shown span the junction between base and collector, it is possible to form them immediately below the base electrode. In addition to Darlington configuration, other transistor configuration may be adopted. That is, it may consist of only a power transistor with the input-side driver transistor $T_2$ omitted. It is also possible to connect Zener diodes between source and gate of the power MOSFET. Or, Zener diodes may be provided between collector and gate of IGBT.

While the above description has dealt mainly with the IC igniter, a field of application in which this invention has originated, it should be noted that the invention can widely be applied to any power transistor device including power MOSFETs and IGBTs that drive inductive loads.

A representative advantage of this invention may be briefly summarized as follows. In the power transistor device, a plurality of pn junctions are formed in a polycrystalline silicon film in the form of rings that circle around the circumference of the chip to form Zener diodes. This arrangement eliminates the end of the pn junction, making it possible to use as a stable Zener voltage the dielectric strength characteristic of the pn junction having a very small temperature coefficient. As a result, the Zener voltage can be kept constant regardless of wide temperature variations.

What is claimed is:

1. A power transistor device on a semiconductor substrate comprising:

a first terminal;

a second terminal;

a third terminal;

a first bipolar transistor which is formed at the semiconductor substrate and which has a base coupled to the first terminal, a collector coupled to the second terminal, and an emitter;

a second bipolar transistor which is formed at the semiconductor substrate and which has a base coupled to the emitter of the first bipolar transistor, a collector coupled to the second terminal and an emitter coupled to the third terminal; and a plurality of Zener diodes and forward diodes coupled in series between the first terminal and the second terminal, wherein the plurality of Zener diodes and forward diodes are formed of pn junctions in a polycrystalline silicon film which has a predetermined width and which is arranged along a circumference of the semiconductor substrate so as to have a ring like shape, and wherein the pn junctions in the polycrystalline silicon film are arranged along the circumference of the semiconductor substrate in rings, respectively.

2. A power transistor device according to claim 1, wherein the polycrystalline silicon film is formed on an insulating film on a main surface of the semiconductor substrate of silicon.

3. A power transistor device according to claim 1, wherein the polycrystalline silicon film is covered by an insulating film.

4. A power transistor device according to claim 1, wherein the plurality of Zener diodes and forward diodes are used as a transformer to form a predetermined voltage to be supplied to an ignition plug outside the power transistor device, and wherein the power transistor device supplies a current to a primary coil outside the power transistor device which is connected to the transformer.

5. A power transistor device according to claim 4, wherein the polycrystalline silicon film is formed over a substantially planar oxide film.

6. A power transistor device according to claim 1, wherein the base of the first bipolar transistor and the base of the second bipolar transistor are arranged at a predetermined portion of the semiconductor substrate so as to have a predetermined space from the circumference of the semiconductor substrate, the predetermined space having a width wider than the width of the polycrystalline silicon film, and wherein the polycrystalline silicon film is arranged over the predetermined space.

* * * * *